(12) United States Patent
Frosien

(10) Patent No.: US 10,504,683 B2
(45) Date of Patent: Dec. 10, 2019

(54) DEVICE AND METHOD FOR FORMING A PLURALITY OF CHARGED PARTICLE BEAMLETS

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiterprüftechnik mbH, Heimstetten (DE)

(*) Notice: Subject to any disclaimer, the term of this patent is extended or adjusted under 35 U.S.C. 154(b) by 0 days.

(21) Appl. No.: 15/902,392

(22) Filed: Feb. 22, 2018

(65) Prior Publication Data
US 2019/0259563 A1   Aug. 22, 2019

(51) Int. Cl.
| H01J 37/09 | (2006.01) |
| H01J 37/10 | (2006.01) |
| H01J 37/153 | (2006.01) |
| H01J 37/244 | (2006.01) |
| H01J 37/28 | (2006.01) |
| H01J 37/147 | (2006.01) |

(52) U.S. Cl.
CPC .............. *H01J 37/09* (2013.01); *H01J 37/10* (2013.01); *H01J 37/1474* (2013.01); *H01J 37/153* (2013.01); *H01J 37/244* (2013.01); *H01J 37/28* (2013.01); *H01J 2237/0453* (2013.01); *H01J 2237/153* (2013.01); *H01J 2237/20221* (2013.01)

(58) Field of Classification Search
CPC .......... H01J 37/09; H01J 37/10; H01J 37/153; H01J 2237/04553; H01J 37/147
See application file for complete search history.

(56) References Cited

U.S. PATENT DOCUMENTS

| 6,483,120 B1* | 11/2002 | Yui | G01N 23/20 250/491.1 |
| 2013/0248731 A1* | 9/2013 | Tanimoto | H01J 37/10 250/396 R |
| 2015/0155134 A1* | 6/2015 | Frosien | H01J 37/05 250/310 |
| 2016/0111251 A1* | 4/2016 | Knippelmeyer | B82Y 10/00 250/398 |

* cited by examiner

*Primary Examiner* — Eliza W Osenbaugh-Stewart
(74) *Attorney, Agent, or Firm* — Kilpatrick Townsend & Stockton LLP

(57) ABSTRACT

Disclosed herein is charged particle beam device and a a method of operating a charged particle beam device, comprising forming a plurality of focused charged particle beamlets. Charged particles are directed from a charged particle source to a multi-aperture plate. A plurality of beamlets are passed through a plurality of apertures of the multi-aperture plate. The beamlets include an inner beamlet of charged particles and a plurality of outer beamlets of charged particles. The outer beamlets are focused to form a plurality of outer focal points on a virtual ring having a center along an optical axis, the outer beamlets subjected to a field curvature aberration, such that the virtual ring is axially displaced relative to a virtual focal point of an uncompensated inner beamlet. A compensated inner beamlet is focused to a compensated focal point. The inner beamlet is compensated to form the compensated inner beamlet; and the compensated focal point is coplanar with the virtual ring.

21 Claims, 8 Drawing Sheets

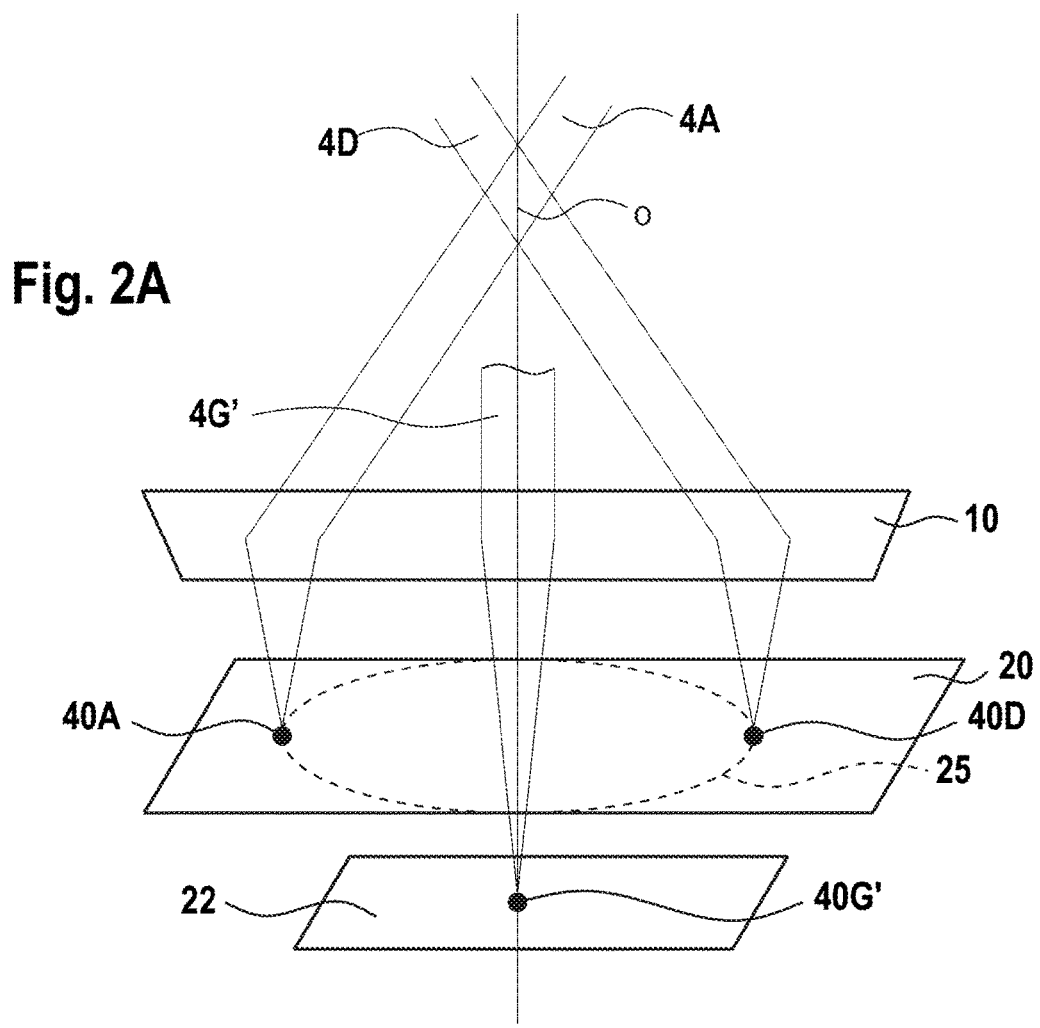

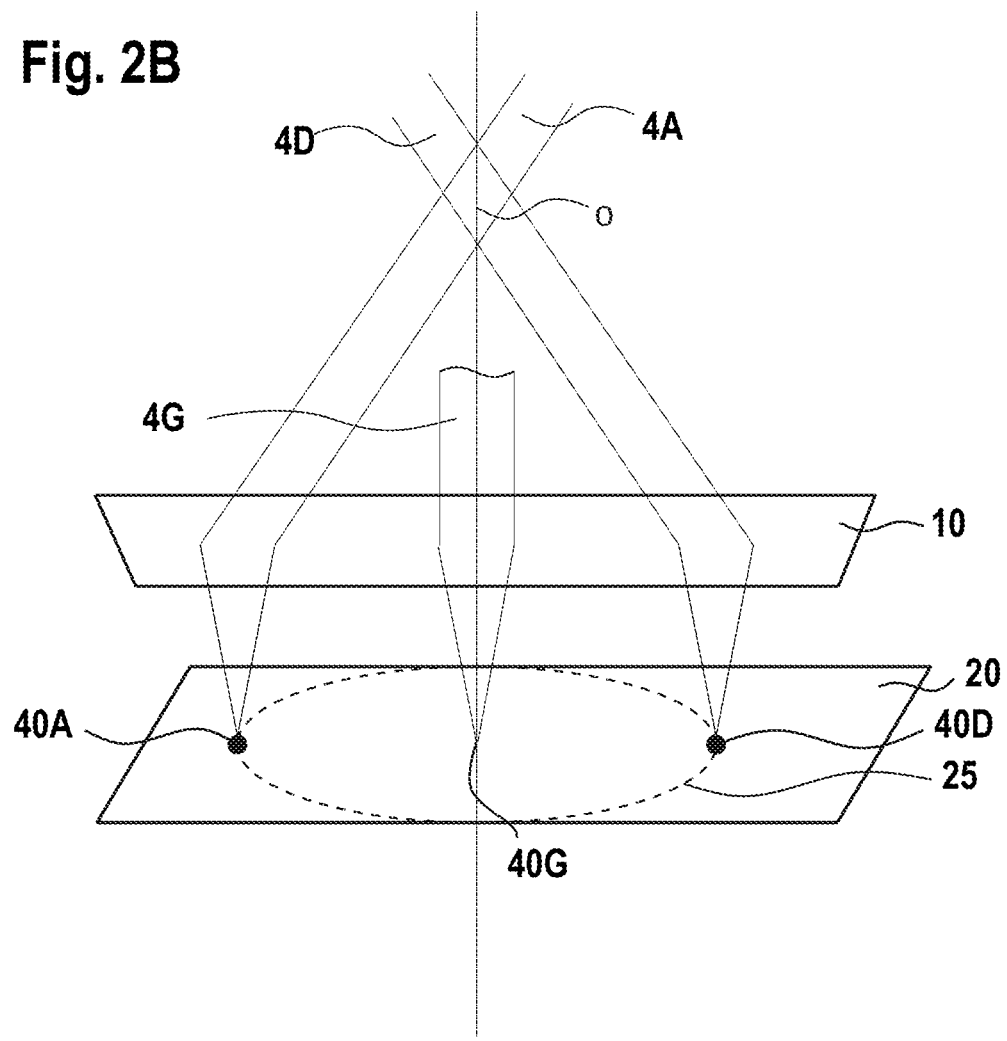

DEVICE AND METHOD FOR FORMING A PLURALITY OF CHARGED PARTICLE BEAMLETS

TECHNICAL FIELD

Embodiments described herein relate to charged particle beam devices for use in inspection, defect detection, and/or critical dimensioning applications. Embodiments also relate to methods of generating beamlets of charged particles, such as a plurality of charged particle beamlets, and devices for generating such beamlets. Multi-beam systems can be used for general purposes such as imaging, and for high throughput electron beam inspection (EBI). Embodiments also may relate to a scanning charged particle beam device and a method of inspection with a scanning charged particle beam device such as a scanning electron microscope (SEM).

BACKGROUND

Charged particle multi-beam systems have many uses, such as inspection of semiconductor devices with nanometer scale features. Modern semiconductor technology is highly dependent on an accurate control of the various processes used during the production of integrated circuits. Accordingly, semiconductor wafers are inspected in order to detect problems. Furthermore, a mask or reticle can be subject to inspection in order to make sure that the mask or reticle accurately defines a desired pattern.

The inspection of wafers or masks for defects can include the examination of the whole wafer or mask area. Thus, there is a challenge to inspect a large area at high resolution. Also, it is desirable to perform inspection rapidly so that production throughput is not limited by the inspection process, if possible.

Scanning electron microscopes (SEM) have been used to inspect wafers. The surface of the wafer can be scanned using a finely focused electron beam. When the electron beam irradiates the wafer, secondary electrons and/or back-scattered electrons, i.e. signal electrons, are generated and can be detected. A defect at a location on the wafer can be detected by comparing an intensity signal of the secondary electrons to, for example, a reference signal corresponding to the same location on the pattern.

Wafer and mask defect inspection in semiconductor technology benefits from high resolution and fast inspection tools, which may cover full wafer/mask application and/or hot spot inspection. Electron beams can be used to provide high resolution inspection of samples so as to be able to detect small defects. In particular, from the 20 nm node and beyond, the high-resolution potential of electron beam based imaging tools is in demand to detect many defects of interest.

However, because of the decreasing feature size and increasing demands for higher resolutions, scanning the entire surface of the wafer can take a long time. Accordingly, using a single-beam scanning electron microscope (SEM) for wafer inspection may not be ideal, because of throughput limitations. A multi-beam SEM is therefore desirable. For example, multiple beams, or beamlets, may allow for simultaneous inspection at multiple locations on the sample, increasing throughput. However, there can be many technical difficulties encountered when using a multi-beam system that require inventive solutions, such as difficulties with generation and control of multiple charged particle beams.

SUMMARY

Herein is disclosed a method of operating a charged particle beam device, including forming a plurality of focused charged particle beamlets. Forming the focused beamlets includes directing charged particles from a charged particle source to a multi-aperture plate, and passing a plurality of beamlets through a plurality of apertures of the multi-aperture plate. The beamlets include an inner beamlet of charged particles and a plurality of outer beamlets of charged particles. The outer beamlets are focused to form a plurality of outer focal points on a virtual ring having a center along an optical axis. The outer beamlets are subject to field curvature aberration, such that the virtual ring is axially displaced relative to a virtual focal point of an uncompensated inner beamlet. The inner beamlet is compensated to form a compensated inner beamlet; which is focused to a compensated focal point. The compensated focal point is coplanar with the virtual ring.

Herein is disclosed a charged particle beam device which includes a charged particle source and a multi-aperture plate. The multi-aperture plate includes an inner aperture for passing an inner beam of charged particles and a plurality of outer apertures, each for passing one of a plurality of outer beamlets of charged particles. Each of the outer apertures is substantially equidistant from an optical axis. An objective lens configured to focus the outer beamlets to a plurality of focal points on a virtual ring having a center along the optical axis is also included in the charged particle beam device. The objective lens is configured to subject the outer beamlets to a field curvature aberration which axially displaces the virtual ring relative to a virtual focal point of an uncompensated inner beamlet. The charged particle beam device includes a compensation lens, located between the charged particle source and the objective lens, configured to operate on the inner beamlet to form a compensated inner beamlet. The compensation lens is configured to axially offset a compensated focal point of the inner beamlet from the virtual focal point, such that the compensated focal point of the compensated inner beamlet is coplanar with the virtual ring.

Embodiments are also directed at apparatuses for carrying out the disclosed methods and include apparatus parts for performing each described method features. The method features may be performed by way of hardware components, a computer programmed by appropriate software, by any combination of the two or in any other manner. Furthermore, embodiments are also directed at methods which can be carried out by the described apparatus. Embodiments include method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following:

FIG. 2A illustrates field curvature effects on beamlets, according to embodiments described herein;

FIG. 2B illustrates compensated field curvature effects on beamlets, according to embodiments described herein;

DETAILED DESCRIPTION OF EMBODIMENTS

Figure 1:
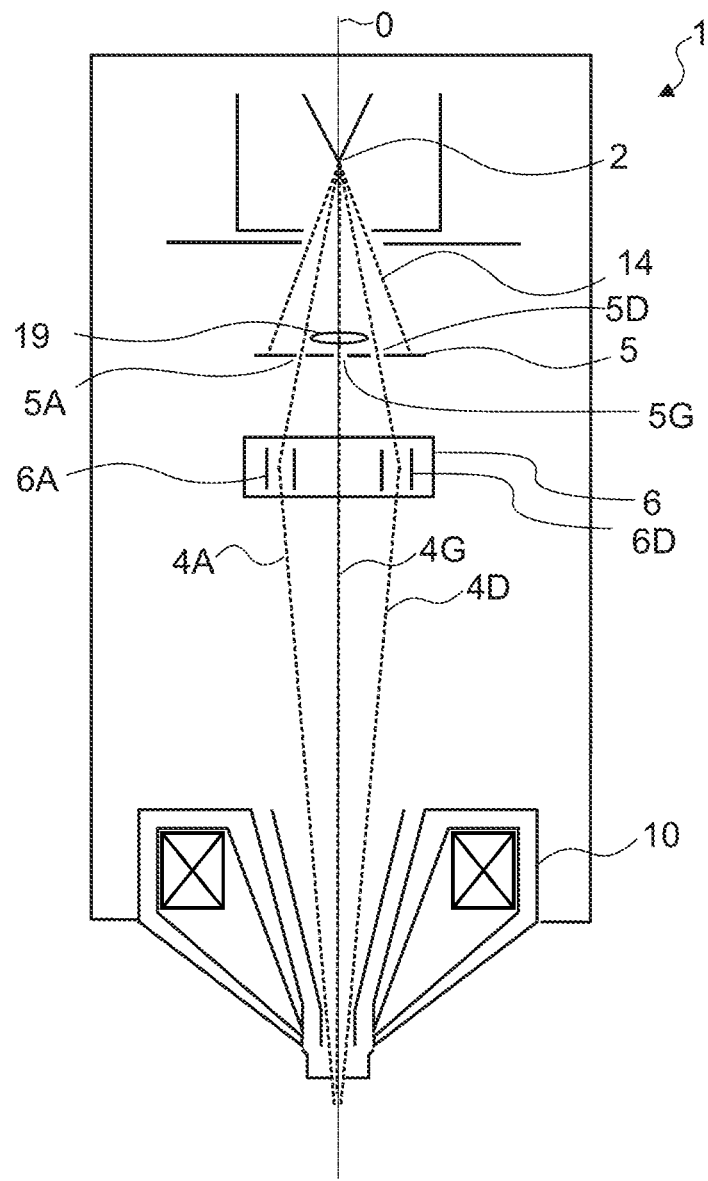
FIG. 1 shows a schematic drawing of a charged particle beam device according to embodiments described herein.

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following, the charged particle beam device or components thereof can be referred to as a charged particle beam device which may include components for the detection of secondary or backscattered particles, such as electrons. Embodiments can include apparatuses and components that may detect secondary and/or backscattered charged particles in the form of electrons, ions, photons, X-rays and/or other signals which may be used to obtain a specimen image. As described herein, discussions and descriptions relating to the detection are exemplarily described with respect to electrons in scanning electron microscopes. Other types of charged particles, e.g. positive ions, can be detected by the device in a variety of different instruments.

Herein, a primary charged particle beam or a primary charged particle beamlet can be generated by a particle beam source and can be guided to a specimen to be inspected and/or imaged.

Herein a beam can be a primary beam; a beamlet can be a primary beamlet. A primary beam or beamlet is for irradiating a sample.

According to embodiments herein, which can be combined with other embodiments, a signal (charged particle) beam, or a signal (charged particle) beamlet can be referred to as a beam of secondary particles, i.e. secondary and/or backscattered particles. Typically, the signal beam or secondary beam is generated by the impingement of the primary beam or primary beamlet on a specimen or by backscattering of the primary beam from the specimen.

A "specimen" or "sample" as referred to herein, includes, but is not limited to, semiconductor wafers, semiconductor workpieces, photolithographic masks and other workpieces such as memory disks and the like. Embodiments may be applied to any workpiece on which material is deposited or which is structured. A specimen can include a surface to be structured or on which layers are deposited, an edge, and typically a bevel.

"Scanning" as used herein refers to motion along at least one direction, such as movement or scanning of a beamlet, such as for irradiating a sample.

According to some embodiments, which can be combined with other embodiments described herein, the apparatus and methods are configured for or are applied for electron beam inspection, for critical dimensioning applications and defect review applications.

FIG. 1 shows, according to an embodiment, a charged particle beam device 1 for forming a plurality of focused charged particle beamlets 4A, 4D, 4G, such as for sample inspection. The charged particle beam device 1 includes a charged particle source 2, which can generate charged particles which are directed to a multi-aperture plate 5. The apertures 5A, 5D, 5G of the multi-aperture plate 5 each pass beamlets 4A, 4D, 4G, including an inner beamlet 4G and a plurality of outer beamlets 4A, 4D. The beamlets can be focused, such as by an objective lens 10, to form a plurality of focal points.

The charged particle beam device 1 may include a deflector 6, which may have component deflectors 6A, 6D which may direct at least the outer beamlets 4A, 4D to the objective lens 10. The deflector 6 may also operate on the inner beamlet 4G, or the inner beamlet 4G may not pass through the deflector 6, the deflector operating exclusively on the outer beamlets 4A, 4D. The deflector may be located on the opposite side of the multi-aperture plate 5 from the source 2. The deflector 6 may cause the beamlets to appear to come from spatially separate sources. Alternatively/additionally, the charged particle beam device 1 may include a condenser lens (not shown) which may be placed, for example, between the source 2 and the multi-aperture plate 5. The condenser lens may guide the charged particles directly to the multi-aperture plate 5. Alternatively/additionally, a condenser lens may be placed after the multi-aperture plate 5, such as immediately after the multi-aperture plate 5. A condenser lens may collimate the charged particles and/or guide them, directly or indirectly, toward the objective lens 10. The deflector 6, objective lens 10, and a condensor lens can be configured such that each focal point of the outer beamlets 4A, 4D forms an image of the source 2.

FIG. 2A shows the effect of field curvature, which can be induced by an objective lens 10. The field curvature can axially shift the focal plane 20 of the outer beamlets 4A, 4D relative to the uncompensated focal plane 22 of the uncompensated inner beamlet 4G. The uncompensated inner beamlet 4G' may be at least closer to the optical axis 0 of the objective lens 10 than the outer beamlets 4A, 4D.

The beamlets 4A, 4D, 4G' illustrated in FIG. 2A are uncompensated for field curvature, and two focal planes 20, 22 are illustrated, which can be substantially orthogonal to the optical axis 0. The foci 40A, 40D of the outer beamlets 4A and 4D are on a virtual ring 25 which can be on the focal plane 20. The center of the virtual ring 25 can be on the optical axis 0. The uncompensated focal point 40G' of the uncompensated inner beamlet 4G' can be at least nearer the optical axis than the outer beamlets' focal points 4A, and can be on the optical axis 0. The uncompensated focal point 40G' can be on plane 22, axially displaced relative to the center of the virtual ring 25. The virtual ring 25 on which the foci 40A, 40D of the outer beamlets lie may be circular. The plane 22, on which the uncompensated focal point 40G' is located, is further forward of the objective lens 10 than the focal plane 20.

Field curvature aberration can lead to an axial offset of focus of a beamlet that scales quadratically with the beamlet's radial distance from the optical axis 0. If each of the outer beamlets 4A, 4D are equidistant from the inner beamlet 4G coincident with the optical axis 0, the outer beamlets 4A, 4D may focus to a focal plane 20 which may be significantly axially offset from the uncompensated focal plane 22 of the inner beamlet 4G.

FIG. 2B shows a compensated inner beamlet 4G which is focused to a compensated focal point 40G that is coplanar with the virtual ring 25 of the foci 40A, 40B of the outer beamlets 4A, 4D, according to embodiments described herein. The compensated focal point 40G is axially offset relative to the uncompensated focal point 40G' of the uncompensated inner beamlet 4G' seen in FIG. 2A. The compensated focal point 40G of the compensated inner beamlet 4G, and optionally the compensated inner beamlet 4G, can be on the optical axis 0. The outer beamlets 4A, 4D of FIG. 2B can be uncompensated for field curvature, and the foci 40A, 40D of the outer beamlets can be in the same focal plane 20.

The compensated inner beamlet 4G can be compensated for the field curvature induced in the outer beamlets 4A, 4D, such as the field curvature of the outer beamlets 4A, 4D induced by the objective lens 10. Field curvature may alternatively/additionally introduced by other components, such as a condenser lens. Field curvature may influence the outer beamlets 4A, 4D to a much greater extent than the inner beamlet 4G, particularly outer beamlets 4A, 4D passing significantly far from the optical axis 0. The field curvature of each outer beamlet may be approximately equal, particularly for outer beamlets which are each equidistant from the optical axis. Compensating the inner beamlet(s) 4G can be advantageous because there may be fewer inner beamlets 4G than outer beamlets 4A, 4D, such as exactly one. For example fewer beamlets are compensated when the inner beamlet 4G is compensated rather than each of the plurality of outer beamlets 4A, 4D. There can be exactly one inner beamlet 4G, for example, which can be coaxial with the optical axis 0, the one inner beamlet being compensated and having a focal point 40G on the same plane as the foci 40A, 40D of the outer beamlets. There can be intermediate beamlets that have focal points at a radial distance from the optical axis 0 which is less than the radial distance to the focal points 40A, 40D of the outer beamlets. The outer beamlets 4A, 4D, and the optional intermediate beamlets, can be substantially parallel to the optical axis 0.

As seen in FIG. 1, a compensation lens 19 may operate on the inner beamlet. The compensation lens may compensate the inner beamlet 4G to adjust for the field curvature aberration of the outer beamlets 4A, 4D. The compensation lens 19 can be on the optical axis 0. Each of the outer beamlets 4A, 4D may be subjected to the same amount of field curvature, particularly in cases where the outer beamlets 4A, 4D are radially equidistant from an inner beamlet 4G that is coincidental with the optical axis of the objective lens. The compensation lens 19 can be located such that the compensation lens 19 does not operate on the outer bemlets 4A, 4D, such as only operating on the inner beamlet 4G. The outer beamlets 4A, 4D may be excluded from the compensation lens 19, such as due to the outer beamlets 4A, 4D being located off the optical axis 0, outside the compensation lens 19. For example, only the uncompensated inner beamlet 4G' enters the compensation lens 19, and only the compensated inner beamlet 4G exits the compensation lens 19. The compensation of the uncompensated inner beamlet 4G' can form the compensated inner beamlet 4G, such that the compensated focal point 40G of the compensated inner beamlet 4G is axially offset relative to the virtual uncompensated focal point 40G' of the uncompensated inner beamlet 4G', such that the compensated focal point 40G is coplanar with the virtual ring 25 of the outer beamlets' foci.

The foci 40A, 40D of the outer beamlets 4A and 4D, which can each be equidistant from the compensated focal point 40G of the compensated inner beamlet 4G, can be on the virtual ring 25, such as in the focal plane 20. The center of the virtual ring 25 can be on the optical axis 0, and the compensated focal point 40G of the compensated inner beamlet 4G can be on the optical axis, at the center of the virtual ring 25.

For convenience, FIG. 1 shows two outer beamlets 4A and 4D. However, more outer beamlets are contemplated, such as six outer beamlets in a hexagonal arrangement of outer beamlets. There can be also be 2, 4, 6, or 8 outer beamlets, for example.

The device may impart significant field curvature aberration, particularly to the outer beamlets 4A, 4D which can be significantly radially displaced from the optical axis 0 of the device. The field curvature aberration imparted to the outer beamlets 4A, 4D may be particularly strong from the objective lens 10, which may be strongly focusing, such as having a short focal length. The outer beamlets 4A, 4D may traverse the objective lens off the optical axis. As seen in FIGS. 2A and 2B, the compensated focal point 40G of the compensated inner beamlet 4G is axially offset relative to a virtual uncompensated focal point 40G' of the uncompensated inner beamlet 4G', such that the compensated focal point 40G is coplanar with the virtual ring 25.

Figure 3:
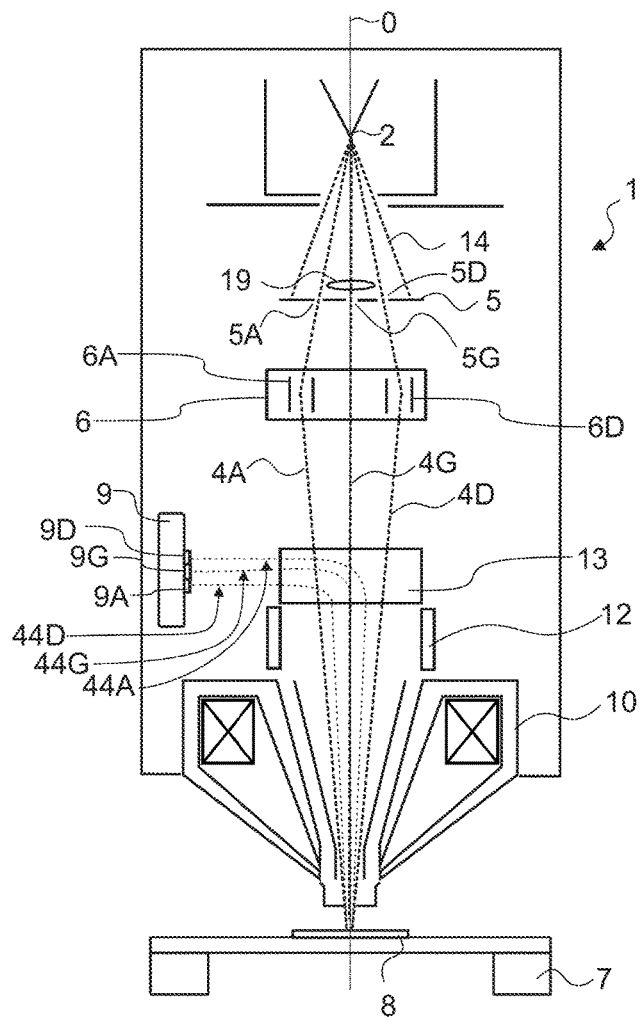
FIG. 3 shows a charged particle beam device, according to embodiments described herein.

FIG. 3 shows a charged particle beam device 1, according to embodiments described herein. The charged particle beam device 1 may include a scanning deflector 12 which can move the charged particle beamlets 4A, 4D, 4G over the surface of a sample 8. The sample 8 may be on a stage 7, such as a translatable stage, which may also aid in moving the sample 8 so as to aid in the imaging and/or inspection of the sample 8. The scanning deflector 12, for example, can scan, such as raster scan, the beamlets over at least a region of the sample 8.

When the beamlets 4A, 4D, 4G strike the surface of the sample 8, they can undergo a series of complex interactions with the sample. The interactions can produce a variety of emissions, such as electrons, X-rays, heat, and light. Many of these emissions can be used to produce the images of the sample and/or to collect data from the sample 8. An emission of interest for examination or image formation of samples is from the secondary electrons that escape from the sample 8 at a variety of angles with relatively low energy (1 to 50 eV).

Signal electrons, including backscattered and/or secondary electrons, can be collected from the specimen through the objective lens 10. The objective lens 10 can collect signal beamlets which may subsequently pass through the beam separator assembly 13. Beamlets of signal electrons can be separated from the beamlets 4A, 4D, 4G in the beam separator assembly 13, and reach the detector assembly 9. The beam separator can selectively pass a plurality of signal beamlets. The plurality of detector elements can detect each of a plurality of signal beamlets collected from the plurality of focal points of the outer beamlets and compensated focal point of the inner beamlet. The detector assembly 9 can include detector elements which can be configured for generation of a measurement signal, e.g. an electronic signal corresponding to detected signal electrons. A computer can receive data generated by the device. As illustrated in FIG. 3, each beamlet 4A, 4D, 4G can create a signal beamlet 44A, 44G, 44D which may be detected by detector elements 9A, 9G, 9D. Other than the signal beamlets 44A, 44G, 44D, the beamlets referred to herein may be understood as "primary beamlets," particularly those beamlets which are used for irradiating the sample.

By irradiating the specimen with the beamlets 4A, 4D, 4G and displaying and/or recording the output of the detector assembly 9, data for inspection/testing of the sample can be provided, including multiple images of the surface of the sample 8. Each image can provide information about a different portion of the surface of the sample. Accordingly, in comparison to single beam devices, the speed of data acquisition can be increased by use of multiple beamlets. The stage 7 (or sample support) can be moveable, such as horizontally movable in all directions. This may allow the beamlets 4A, 4D, 4G to reach target areas on the sample which are to be examined.

A plurality of signal beamlets 44A, 44D, 44G from the outer focal points 40A, 40D and the compensated focal point 40G can be collected, such as by the objective lens 10. The plurality of signal beamlets 44A, 44D, 44G can be separated from the plurality of primary beamlets 4A, 4D, 4G. Each of the plurality of signal beamlets 44A, 44D, 44G can be detected using a plurality of detector elements 9A, 9D, 9G which detect the plurality of signal beamlets 44A, 44D, 44G. Each signal beamlet can substantially correspond to a signal beamlet arising from and/or induced in one of the outer focal points 40A, 40D of the outer beamlets 40A, 40D and the compensated focal point 40G of the compensated inner beamlet 4G, when the charged particles of the primary beamlets interact with the sample. The spacing of the focal points can be adequate so that the signal beamlets can be adequately separated, in order to minimize cross-talk that may arise if different signal beamlets are not separated to ensure that each detector element 9A, 9D, 9G receives substantially exactly one signal beamlet. Each of the plurality of signal beamlets 44A, 44D, 44G can be spatially separated from the other signal beamlets 44A, 44D, 44G such that each detector element 9A, 9D, 9G detects substantially exactly one signal beamlet 44A, 44D, 44G.

Figure 4:
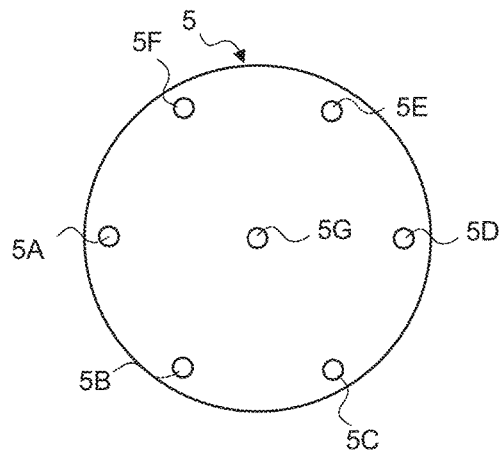
FIG. 4 shows a multi-aperture plate, according to embodiments described herein.

FIG. 4 shows an embodiment of a multi-aperture plate 5. The multi-aperture plate 5 can include an inner aperture 5G and a plurality of outer apertures 5A, 5B, 5C, 5D, 5E, 5F. Each outer aperture can be equally spaced from the inner aperture; alternatively/additionally, each outer aperture can be equally spaced from the nearest outer aperture(s). For the hexagonal arrangement of outer apertures of FIG. 4, each outer aperture can have two nearest outer apertures. The outer apertures 5A-5F can be for passing the plurality of outer beamlets 4A-4F and the inner aperture 5G can be for passing the inner beamlet 4G. FIG. 4 shows, according to an embodiment, a hexagonal array of outer apertures. The outer apertures 5A, 5B, 5C, 5D, 5E, 5F can be on a ring which can be centered on the inner aperture 5G. The multi-aperture plate 5 can be placed in the charged particle beam device 1 so that the optical axis 0 goes through the center of the ring, such as through the inner aperture 5G. As a skilled person understands, the foci of the beamlets, as focused by the objective lens 10, can be arranged similarly as the apertures.

Figure 5:
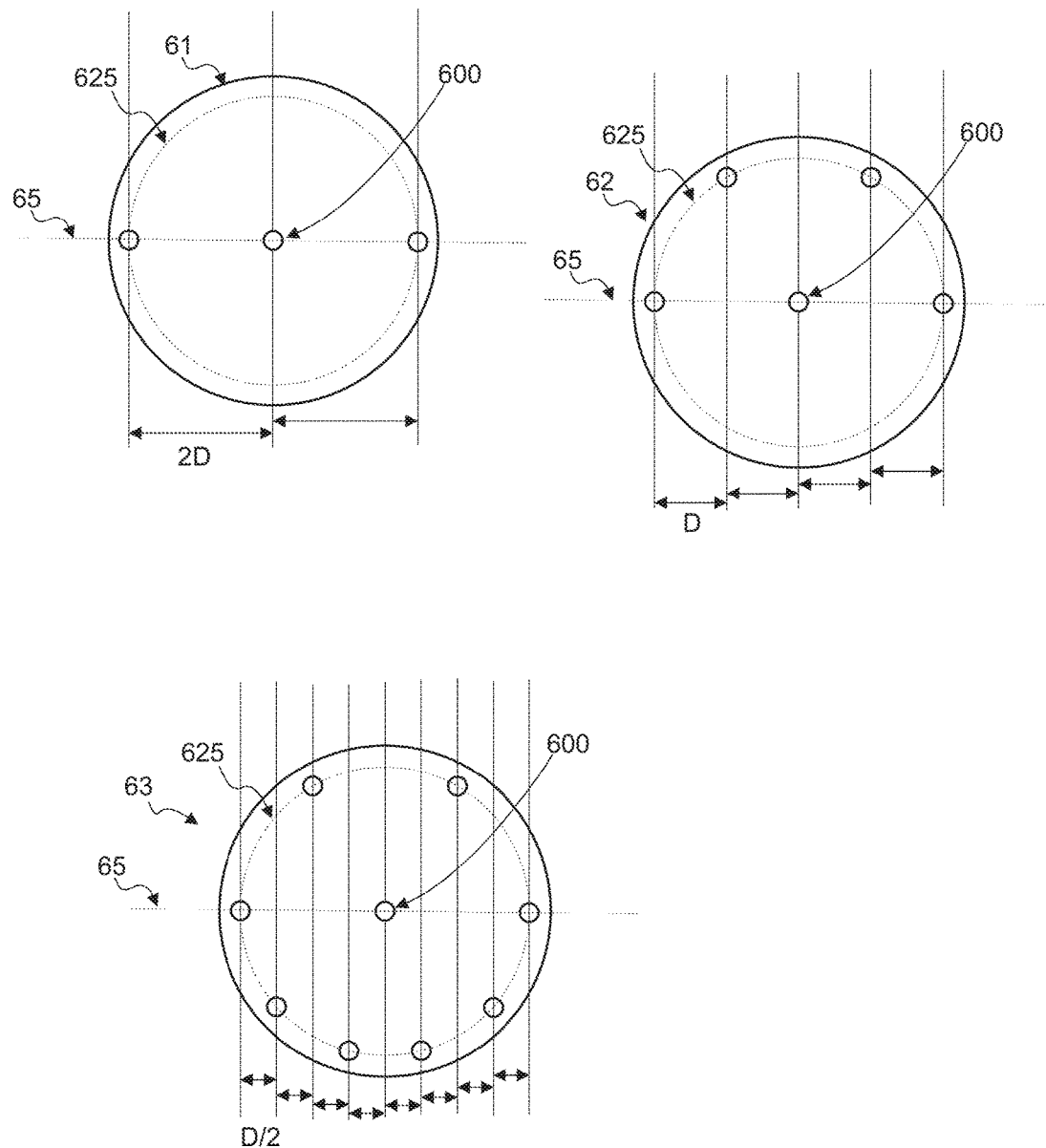
FIG. 5 shows aperture arrangements, according to embodiments described herein.

FIG. 5 shows alternative embodiments of aperture arrangements, according to embodiments described herein, such as of multi-aperture plates 61, 62, 63. In each embodiment, a plurality of outer apertures can be located on a ring 625, which can be equidistant from an inner aperture 600. The apertures can be on a multi-aperture plate 61, 62, or 63, and each multi-aperture plate 61, 62, 63 can be used for passing a plurality of beamlets.

In an embodiment, when the outer apertures are projected onto a virtual line 65 which goes through an inner aperture and is perpendicular to the optical axis 0, the apertures are equally spaced. For example, the equal spacing of multi-aperture plate 62 of FIG. 5 is D. Multi-aperture plate 62 of FIG. 5 has four outer apertures on a ring centered on the inner aperture.

Each aperture can form one of the projections onto the virtual line 65. The projections of the beamlets that pass through the apertures onto the virtual line 65 can be equally spaced, and, furthermore, each beamlet can form one of the projections on the virtual line 65. There can be an equal distance D between each projection, as in multi-aperture plate 62. By comparison, in multi-aperture plate 63, which uses eight apertures on the ring, the equal spacing is D/2; and in multi-aperture plate 61, the equal spacing is 2D. An equal distance, such as 2D (multi-aperture plate 61), D (multi-aperture plate 62), or D/2 (multi-aperture plate 63), can be useful in "flying stage" applications, such as that described for FIG. 6. The multi-aperture plate can be placed in the device so that the optical axis 0 passes through the inner aperture.

Figure 6:
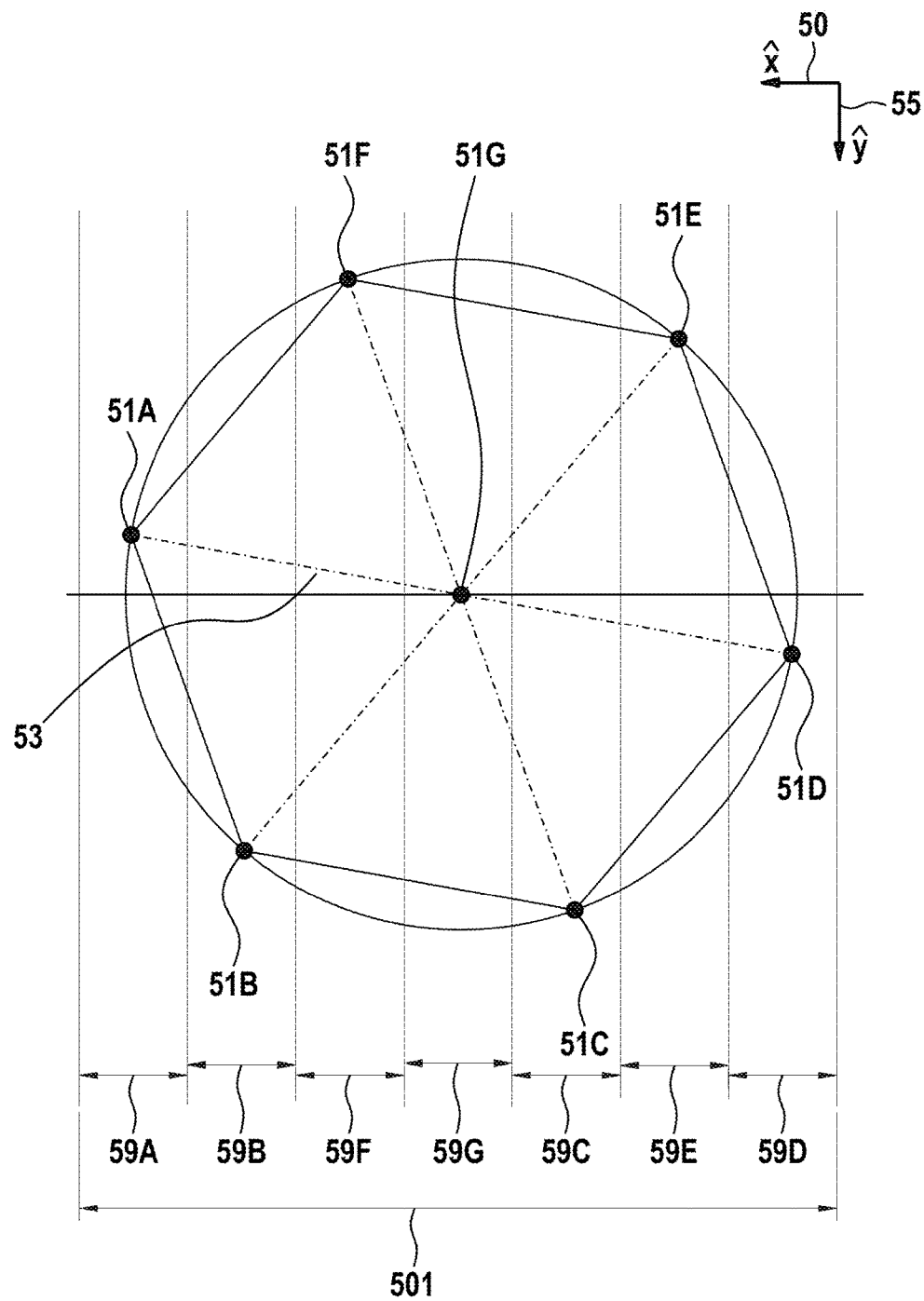
FIG. 6 illustrates a method of scanning, according to embodiments described herein.

FIG. 6 illustrates a method of scanning, according to embodiments described herein, in which the multi-aperture plates shown in FIG. 4 can be used in a "flying-stage" method. As indicated in FIG. 6, each of the focal points 51A-51G of the beamlets can be scanned in the x-direction 50 by a scanning distance and the stage translated in the y-direction 55. The x and y directions can be perpendicular. The scanning deflector 12 can induce the scanning of the beamlets 4A-4G and the stage 7 can provide translational motion of the sample in a direction orthogonal to the scanning direction. The y-direction 55 can be at an angle of about 85° from normal to a line 53 formed by the focal points 51A, 51G, 51D which correspond to the beamlets 4A, 4G, 4D which pass through the respective apertures 5A, 5G, 5D. The scanning motion in the x-direction 50 can be about −5° from the line 53. Such orientation can allow for efficient coverage of an areal band 501 of the sample surface by the plurality of beamlets, such as hexagonally arranged outer beamlets and an additional centered inner beamlet, minimizing overlap of respective strips 59A-59G covered by each respective beamlet 4A-4G.

The scanning of the beamlets and translation of the stage can cause the beamlets to irradiate an areal band 501 of the sample 8 on the stage. The areal band 501 includes an inner strip 59G irradiated by the inner beamlet 4G, and a plurality of outer strips 59A-59F irradiated by the plurality of outer beamlets 4A-4F. The inner strip 59G is between at least two of the outer strips 59A-59F. As depicted in FIG. 6, the inner strip 59G can be directly adjacent to exactly two of the outer strips 59F, 59C. The two outermost strips 59A and 59D are each at an opposite edge of the areal band 501, the inner strip 59G being between the outermost strips 59A and 59D. Intermediate strips can take up the remainder of the areal band 501, which are each irradiated, respectively, by the remainder of the beamlets.

The stage can be operated to move in a translation direction, the y-direction 55, while the beamlets are scanned in an orthogonal direction, the x-direction 50. The stage can be translated in stepwise or continuous fashion. Translating the stage in a single direction while scanning beamlets in a perpendicular direction can be advantageous because stage settling time can be avoided, and the data collection, testing, and/or image acquisition can be more rapid.

Figure 7A:
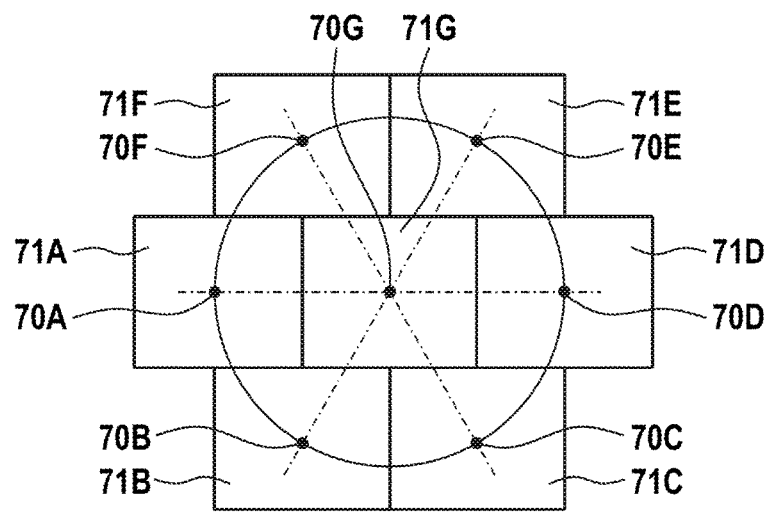
FIG. 7A illustrates a method of scanning, according to embodiments described herein.

FIG. 7A illustrates, according to embodiments described herein, methods in which each of the plurality of beamlets is raster scanned. Each raster scanned beamlet irradiates one of a plurality of regions 71A-71G of a sample area on a stage. The inner beamlet 70G irradiates an inner region 71G, and the plurality of outer beamlets 70A-70F irradiate a plurality of outer regions of the area of the sample. The outer area includes a plurality of regions 71A-71F including a first outer region 71A irradiated by a first outer beamlet 70A, and a second outer region 71B irradiated by a second outer beamlet 70B and so on. Each of the plurality of regions 71A-71F has a length and a width, which can be the same for each region 71A-71F; and the inner region 71G too can have the same length and the width as each of the outer regions 71A-71F.

The scanning method may include mechanical scanning by a stage, on which the specimen is located, and the mechanical scanning may operate in combination with scanning of the charged particle beam by the deflector 12. Utilizing a scanning stage 7 may increase the throughput of the device.

Figure 7B:
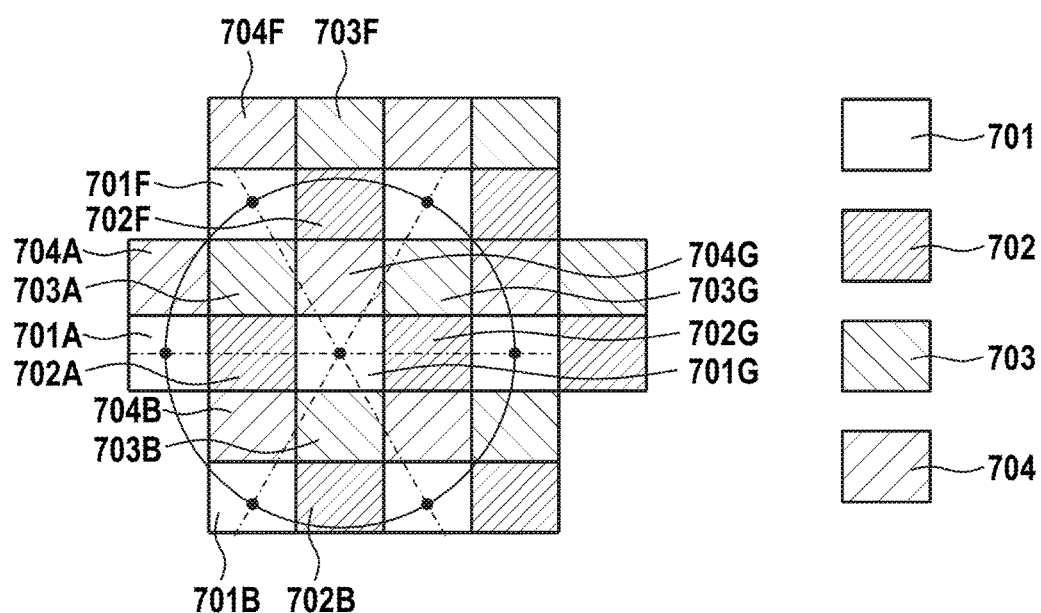
FIG. 7B illustrates a method of scanning, according to embodiments described herein.

As illustrated in FIG. 7B, an inner region which is irradiated by the compensated inner beamlet can include a plurality of inner sub-regions 701G, 702G, 703G, 704G. Each outer region can include a plurality of outer sub-regions. For example, a first outer region can include a plurality of first outer sub-regions 701A, 702A, 703A, 704A. A second outer region can include a plurality of second outer sub-regions 701B, 702B, 703B, 704B. Additional outer regions can similarly have sub-regions as described for the first and second outer regions. Each $N^{th}$ outer region can be irradiated by an $N^{th}$ outer beamlet. Having a value of N of 3, 5, 7, or 9 is particularly contemplated. These values of N can allow for a reasonable and achievable separation distance between focal points, such that signal beamlets from each focal point can be collected and detected with minimal or reasonably low cross-talk between the detected signal beamlets.

The inner beamlet can sequentially raster scan each of the inner sub-regions 701G, 702G, 703G, 704G; and, as the inner beamlet sequentially raster scans each of the inner sub-regions of the inner region, the first outer beamlet can sequentially raster scan the first outer sub-regions 701A, 702A, 703A, 704A; and, simultaneously, the second outer beamlet can sequentially raster scan the second outer sub-regions 701B, 702B, 703B, 704B. The remainder of the outer regions, and their respective sub-regions, can be similarly scanned.

In other words, each beamlet scans, in sequence, sub-regions (e.g. 701G, 702G, 703G, 704G), which, when taken together, form a region scanned by that particular beamlet. For example, each beamlet 70A-70G may scan a respective sub-region while each other beamlet 70A-70G simulataneously scans a corresponding sub-region of a different region.

Scanning and/or the movement of the beamlets from one sub-region to another may occur by translation of the stage, which may be required in some embodiments, such as to allow for imaging of large areas of the sample. For example, a plurality of beamlets simultaneously scans sub-regions 701A-G by operation of the deflector 12; subsequently, the stage is translated, and the plurality of beamlets simultaneously scans sub-regions 702A-G. When stage translation is used, the beamlets may cover a larger area.

Scanning, such as scanning illustrated by FIGS. 7A and 7B and described above, can be performed by the deflector 12. Each of the beamlets 70A-70G may be scanned by operation of the deflector 12, which may commonly scan each of the beamlets 70A-70G. Each beamlet 70A-70G may scan its corresponding sub-regions and/or regions due to a common deflection of each beamlet 70A-70G by the deflector 12.

Figure 8:
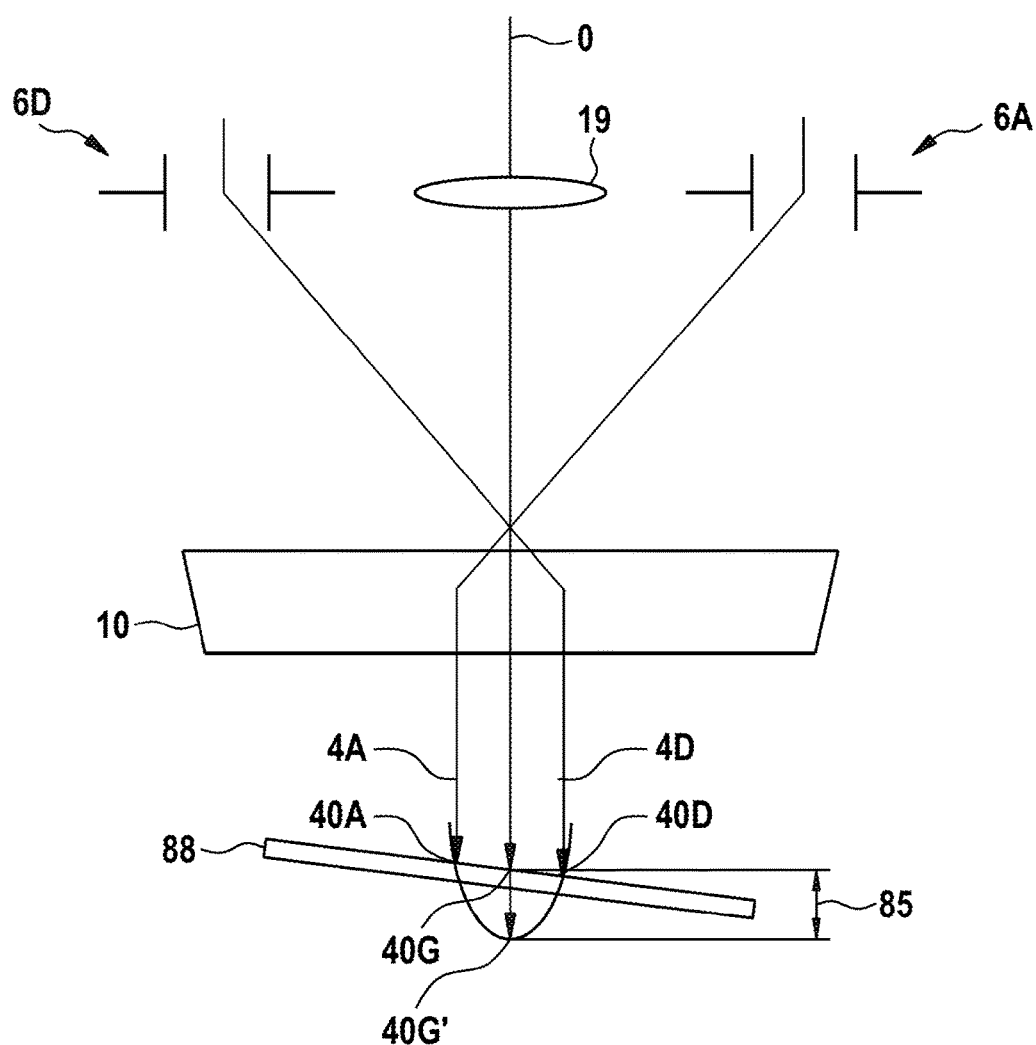
FIG. 8 illustrates, according to embodiments described herein, operation of a charged particle beam device.

FIG. 8 illustrates, according to embodiments described herein, a sample 88 which is oriented non-normally to the optical axis 0 of the charged particle beam device 1. In many applications, the sample 88 can be substantially flat. A substantially flat sample may be oriented normally or non-normally to the optical axis 0 of the charged particle beam device. In an embodiment, the compensation lens 19 can operate such that the compensated focal point 40G of the compensated inner beamlet 4G is axially offset relative to the virtual uncompensated focal point 40G' of the uncompensated inner beamlet, such that the compensated focal point 40G is coplanar with the virtual ring 25 on which the foci 40A, 40D of the outer beamlets 4A, 4D lie. The operation of the deflector 6, for example, may adjust the virtual ring 25 on which the outer beamlets 4A, 4D are focused to be coplanar with a non-normally oriented sample 88. The virtual ring 25 (see FIG. 2B) may be non-normal to the optical axis 0.

Each of the plurality of outer beamlets 4A, 4D can be substantially equidistant from an optical axis 0 of the charged particle beam device at an axial location along the optical axis 0 of the device. Each of the plurality of outer beamlets 4A, 4D may maintain equidistance from the optical axis 0, although the distance may change along the optical axis. For example, the outer beamlets 4A, 4D can each cross the optical axis 0 and/or the inner beamlet 4G at one or more axial locations along the optical axis 0 (as in FIG. 8). The outer beamlets 4A, 4D can be arranged symmetrically along the optical axis 0 of the device. The inner beamlet 4G may be coincident with the optical axis 0 of the charged particle beam device 1.

The outer beamlets may cross the optical axis 0 in front of the objective lens, i.e. before entering the objective lens, such as at a coma free point (see FIGS. 2A and 2B, for example). A cross-over may be within the objective lens; and a coma free cross-over point may be within the objective lens. The outer beamlets 4A, 4D may be off-axis, or off the optical axis 0 of the device.

Alternatively/additionally, the component deflectors 6A, 6D may be operated so as to adjust the virtual ring 25 to be coplanar with a non-normally oriented sample 88. Such an adjustment and/or correction to the beamlets 4A, 4D (such as by the deflector 6) may cause the virtual ring 25 to be oriented non-normally to the optical axis 0. Each of the beamlets 4A, 4D may cross the optical axis at a different point, which may be as a result of an adjustment or correction for orienting the virtual ring 25 non-normally to the optical axis. In other words, one of the beamlets 4A may cross the optical axis 0 at a higher position than another beamlet 4D. This may cause the distance of the beamlets 4A, 4D from the optical axis 0 to be nonequal, such as slightly nonequal. For small angles (e.g. due to samples that are slightly non-normally oriented), the variation in the distance of the beamlets 4A, 4D can be negligible.

It is possible that each of the outer beamlets 4A, 4D crosses the optical axis 0 at or near a coma free point. Deviations are possible, such as for samples that are oriented non-normally to the optical axis 0. Each of the beamlets 4A, 4D may cross the optical axis at different positions. If a beamlet 4A crosses the optical axis at a higher position, it may increase the field curvature aberration; and when a beamlet 4D crosses the optical axis at a lower position, this may decrease field curvature aberration (and generates a deeper focus). The virtual ring 25 along which the focii 40A, 50D of the outer beamlets lie may be non-normal to the optical axis 0. The virtual ring 25 may be coplanar with the non-normally oriented sample 88.

In an embodiment that may be combined with any other embodiment described herein, the outer beamlets are subjected to the field curvature aberration by being focused by an objective lens; and the outer beamlets traverse the objective lens off the optical axis.

In an embodiment that may be combined with any other embodiment described herein, each of the outer beamlets crosses the optical axis in front of the objective lens, or before passing through the objective lens. Alternatively, each of the outer beamlets crosses the optical axis within the objective lens. Crossing of the outer beamlets with the optical axis can be such that coma is eliminated or substantially reduced.

While the foregoing is directed to embodiments of the disclosure, other and further embodiments of the disclosure may be devised without departing from the basic scope thereof, and the scope thereof is determined by the claims that follow.

The invention claimed is:

1. A method of operating a charged particle beam device, comprising;
   forming a plurality of focused charged particle beamlets, comprising:
      directing charged particles from a charged particle source to a multi-aperture plate;
      passing a plurality of beamlets through a plurality of apertures of the multi-aperture plate, the beamlets including:
         an inner beamlet of charged particles, and
         a plurality of outer beamlets of charged particles;
      focusing the outer beamlets with an objective lens to form a plurality of outer focal points on a virtual ring having a center along an optical axis, the outer beamlets subjected to a field curvature aberration, such that the virtual ring is axially displaced relative to a virtual focal point of an uncompensated inner beamlet;
      focusing a compensated inner beamlet to a compensated focal point;
      compensating the inner beamlet to form the compensated inner beamlet, such that the compensated focal point is coplanar with the virtual ring, the compensated inner beamlet being compensated for the field curvature aberration induced in the outer beamlets by the objective lens, the outer beamlets being uncompensated for the field curvature aberration, wherein the multi-aperture plate comprises an inner aperture for passing the inner beamlet and a plurality of outer apertures, each for passing one of the plurality of outer beamlets; each of the outer apertures being substantially equidistant from the optical axis.

2. The method of claim 1, wherein
the compensating of the inner beamlet being performed by a compensation lens on the optical axis, the compensation lens operating only on the inner beamlet and not operating on the outer beamlets.

3. The method of claim 1, wherein
the compensated focal point and the plurality of outer focal points, projected onto a virtual line through the compensated focal point and coplanar with the virtual ring, form equally spaced projections on the virtual line; and
each of the equally spaced projections are formed by one of the compensated focal point and the plurality of outer focal points.

4. The method of claim 1, wherein
each of the outer focal points being equally spaced from each nearest outer focal point; and there is two, four, six, or eight outer beamlets.

5. The method of claim 1, further comprising:
collecting a plurality of signal beamlets from the outer focal points and the compensated focal point;
detecting each of the plurality of signal beamlets, using a plurality of detector elements which detect the plurality of signal beamlets, each signal beamlet substantially corresponding to the signal beamlet from one of the outer focal points and the compensated focal point of the compensated inner beamlet interacting with a sample.

6. The method of claim 5, wherein
each of the plurality of signal beamlets is spatially separated from the other signal beamlets such that each detector element detects substantially exactly one signal beamlet.

7. The method of claim 1, wherein the optical axis passes through the inner aperture.

8. The method of claim 1, further comprising:
scanning each of the beamlets a scanning distance, in a scanning direction perpendicular to a translation direction of a stage;
translating the stage in the translation direction;
the scanning of the beamlets and the translating of the stage irradiating an areal band of a sample on the stage;
the areal band comprising an inner strip irradiated by the inner beamlet, and a plurality of outer strips irradiated by the plurality of outer beamlets; and
the inner strip is between at least two of the outer strips.

9. The method of claim 8, wherein
the inner strip being directly adjacent to exactly two of the outer strips; and
the plurality of outer strips comprising exactly two outermost strips, each at an opposite edge of the areal band, the inner strip being between the outermost strips.

10. The method of claim 1, further comprising:
raster scanning each of the beamlets, irradiating an area of a sample on a stage;
the inner beamlet irradiating an inner region of the sample;
the plurality of outer beamlets irradiating an outer area of the sample;
the outer area comprising a plurality of regions including a first outer region irradiated by a first outer beamlet, and a second outer region irradiated by a second outer beamlet;
each of the plurality of regions having a length and a width;
the inner region having the length and the width.

11. The method of claim 10, wherein
the inner region including a plurality of inner sub-regions;
the first outer region including a plurality of first outer sub-regions, the second outer region including a plurality of second outer sub-regions;
the inner beamlet sequentially raster scanning each of the inner sub-regions; and
as the inner beamlet sequentially raster scans each of the inner sub-regions of the inner region, the first outer beamlet sequentially raster scans the first outer sub-regions and the second outer beamlet sequentially raster scans the second outer sub-regions.

12. The method of claim 11, further comprising:
translating the stage after:
   raster scanning, with the inner beamlet, a first inner sub-region of the plurality of inner sub-regions; and
   simultaneously raster scanning, with the first outer beamlet, a first first outer sub-region of the plurality of first outer sub-regions; and simultaneously raster scanning, with the second outer beamlet, a first second outer sub-region of the plurality of second outer sub-regions;
so that subsequently
the inner beamlet irradiates a second inner sub-region of the plurality of inner subregions,
the first outer beamlet irradiates a second first outer sub-region of the first outer sub-regions, and
the second outer beamlet irradiates a second second outer sub-region of the second outer sub-regions.

13. A charged particle beam device comprising:
a charged particle source and a multi-aperture plate, the multi-aperture plate comprising an inner aperture for passing an inner beam of charged particles and a plurality of outer apertures, each for passing one of a plurality of outer beamlets of charged particles; each of the outer apertures being substantially equidistant from an optical axis;
an objective lens configured to focus the outer beamlets, uncompensated for a field curvature aberration, to a plurality of focal points on a virtual ring having a center along the optical axis, the objective lens configured to subject the outer beamlets to the field curvature aberration which axially displaces the virtual ring relative to a virtual focal point of an uncompensated inner beamlet;
and
a compensation lens, located between the charged particle source and the objective lens, configured to operate on the inner beamlet to form a compensated inner beamlet, the compensation lens configured to axially offset a compensated focal point of the inner beamlet from the virtual focal point,
such that the compensated focal point of the compensated inner beamlet is coplanar with the virtual ring.

14. The charged particle beam device of claim 13, the compensation lens, located on the optical axis, configured to operate on the inner beamlet such that the compensated inner beamlet is compensated for the field curvature aberration induced in the uncompensated outer beamlets by the objective lens; each outer beamlet being equally spaced from each nearest outer beamlet.

15. The charged particle beam device of claim 13, wherein
the inner aperture and the plurality of outer apertures, projected on to a virtual line through the inner aperture and perpendicular to the optical axis, form equally spaced projections on the virtual line.

16. The charged particle beam device of claim 13, the compensation lens being a separate lens integrated with a condenser lens, the multi-aperture plate, or the objective lens;
wherein
the compensation lens configured to operate only on the inner beamlet and not the outer beamlets and the charged particle beam device is configured such that the outer beamlets are uncompensated for the field curvature aberration.

17. The charged particle beam device of claim 13, the compensation lens being between a condenser lens and the multi-aperture plate.

18. The charged particle beam device of claim 13, further comprising:
a plurality of detector elements configured to detect each of a plurality of signal beamlets collected from the plurality of focal points of the outer beamlets and compensated focal point of the inner beamlet.

19. The charged particle beam device of claim 13, further comprising:
a beam separator assembly through which the signal beamlets are selectively passed.

20. The charged particle beam device of claim 13, further comprising:
a deflector located on the opposite side of the multi-aperture plate from the source;
the objective lens, deflector, and a condenser lens being configured such that each focal point of the outer beamlets forms an image of the source.

21. A charged particle beam device comprising:
a charged particle source and a multi-aperture plate, the multi-aperture plate comprising an inner aperture for passing an inner beam of charged particles and a plurality of outer apertures arranged in a hexagon shape for passing a plurality of outer beamlets;
an objective lens configured to focus inner beamlet and the plurality of outer beamlets, and configured to subject each of the outer beamlets to a field curvature aberration, the outer beamlets being uncompensated for the field curvature aberration induced by the objective lens; and
a compensation lens, located between the charged particle source and the objective lens configured to compensate only the inner beamlet such that the objective lens focuses the inner beamlet onto the same plane as the focii of the outer beamlets.

* * * * *